(12) United States Patent
Katoh et al.

(10) Patent No.: US 10,524,365 B2
(45) Date of Patent: Dec. 31, 2019

(54) CERAMIC SUBSTRATE

(71) Applicant: NGK SPARK PLUG CO., LTD., Nagoya-shi, Aichi (JP)

(72) Inventors: Tatsuya Katoh, Nagoya (JP); Masanori Ito, Nagoya (JP); Masaki Kutsuna, Ohbu (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 273 days.

(21) Appl. No.: 15/542,871

(22) PCT Filed: Jan. 8, 2016

(86) PCT No.: PCT/JP2016/000081
§ 371 (c)(1),
(2) Date: Jul. 11, 2017

(87) PCT Pub. No.: WO2016/114120
PCT Pub. Date: Jul. 21, 2016

(65) Prior Publication Data
US 2018/0027653 A1    Jan. 25, 2018

(30) Foreign Application Priority Data

Jan. 13, 2015 (JP) .................. 2015-003819

(51) Int. Cl.
*B32B 5/14* (2006.01)
*H05K 3/40* (2006.01)
(Continued)

(52) U.S. Cl.
CPC .............. *H05K 3/40* (2013.01); *B32B 9/005* (2013.01); *C03C 4/14* (2013.01); *C03C 10/0054* (2013.01); *C04B 35/6303* (2013.01); *H01L 23/15* (2013.01); *H05K 1/0296* (2013.01); *H05K 1/0306* (2013.01); *H05K 1/09* (2013.01);
(Continued)

(58) Field of Classification Search
None
See application file for complete search history.

(56) References Cited

U.S. PATENT DOCUMENTS

2007/0023388 A1    2/2007  Nair et al.
2018/0014408 A1*   1/2018  Katoh ................. H05K 1/09

FOREIGN PATENT DOCUMENTS

CN    102332320 A     1/2012
JP    H05-298918 A    11/1993
(Continued)

OTHER PUBLICATIONS

European Patent Office, Extended European Search Report issued in corresponding Application No. 16737191.3, dated Jul. 27, 2018.
(Continued)

*Primary Examiner* — Seth Dumbris
(74) *Attorney, Agent, or Firm* — Stites & Harbison, PLLC; Jeffrey A. Haeberlin; James R. Hayne

(57) ABSTRACT

A ceramic substrate includes a ceramic layer mainly formed of a glass ceramic and a conductor trace mainly formed of silver (Ag). In an adjacent region located adjacent to the conductor trace, the concentration of boron atoms (B) contained in the ceramic layer increases toward the conductor trace.

5 Claims, 3 Drawing Sheets

(51) Int. Cl.
*H05K 1/09* (2006.01)
*H05K 3/28* (2006.01)
*H05K 3/12* (2006.01)
*H05K 3/46* (2006.01)
*C03C 4/14* (2006.01)
*C03C 10/00* (2006.01)
*H05K 1/03* (2006.01)
*H05K 1/02* (2006.01)
*H05K 3/32* (2006.01)
*C04B 35/63* (2006.01)
*H01L 23/15* (2006.01)
*B32B 9/00* (2006.01)

(52) U.S. Cl.
CPC ............... *H05K 1/092* (2013.01); *H05K 3/12* (2013.01); *H05K 3/1291* (2013.01); *H05K 3/28* (2013.01); *H05K 3/285* (2013.01); *H05K 3/321* (2013.01); *H05K 3/4061* (2013.01); *H05K 3/46* (2013.01); *H05K 3/4664* (2013.01); *B32B 2307/202* (2013.01); *C03C 2204/00* (2013.01); *C04B 2237/40* (2013.01); *C04B 2237/704* (2013.01); *H05K 3/4629* (2013.01); *H05K 2201/017* (2013.01); *H05K 2201/0769* (2013.01); *H05K 2203/1126* (2013.01); *Y10T 29/49163* (2015.01); *Y10T 428/12458* (2015.01)

(56) References Cited

FOREIGN PATENT DOCUMENTS

| | | |
|---|---|---|
| JP | H06-019926 B2 | 3/1994 |
| JP | H06-204511 A | 7/1994 |
| JP | H06-252524 A | 9/1994 |
| JP | H07-135394 A | 5/1995 |
| JP | H09-246722 A | 9/1997 |
| JP | H11-066951 A | 3/1999 |
| JP | H11-339560 A | 12/1999 |
| JP | 2001-278657 A | 10/2001 |
| JP | 2006-073280 A | 3/2006 |
| JP | 2006-253600 A | 9/2006 |
| JP | 2007-059390 A | 3/2007 |
| JP | 4797534 B2 | 3/2007 |
| JP | 2007-234537 A | 9/2007 |
| JP | 2014-179473 A | 9/2014 |

OTHER PUBLICATIONS

Japan Patent Office, Office Action issued in corresponding Application No. JP 2016-541726, dated Jun. 20, 2017.
Japan Patent Office, Office Action issued in corresponding Application No. JP 2016-541738, dated Jun. 20, 2017.
Japan Patent Office, International Search Report issued in corresponding Application No. PCT/JP2016/000081, dated Apr. 5, 2016.
Japan Patent Office, Written Opinion issued in corresponding Application No. PCT/JP2016/000081, dated Apr. 5, 2016.
The State Intellectual Property Office of the People's Republic of China, Office Action issued in corresponding Application No. 201680005732.7, dated Oct. 15, 2018. (English translation not available.).

\* cited by examiner

| Sample | Conductor Paste | | | Material of Green Sheet | Firing Temperature (°C) | Boron Diffusion Distance (µm) | Silver Diffusion Distance (µm) | Evaluation |
|---|---|---|---|---|---|---|---|---|
| | Primary Material | Additive Material | Amount (vol.%) | | | | | |
| S01 | Ag | LaB$_6$ | 9 | SiO$_2$-B$_2$O$_3$-CaO glass + Al$_2$O$_3$ | 850 | 3 to 5 | Less than 5 | AA |
| S02 | Ag | SiB$_6$ | 9 | SiO$_2$-B$_2$O$_3$-CaO glass + Al$_2$O$_3$ | 850 | 3 to 5 | Less than 5 | AA |
| S03 | Ag | TiB$_2$ | 9 | SiO$_2$-B$_2$O$_3$-CaO glass + Al$_2$O$_3$ | 850 | 3 to 5 | Less than 5 | AA |
| S04 | Ag | LaB$_6$ | 3 | SiO$_2$-B$_2$O$_3$-CaO glass + Al$_2$O$_3$ | 850 | 3 to 5 | Less than 5 | AA |
| S05 | Ag | SiB$_6$ | 3 | SiO$_2$-B$_2$O$_3$-CaO glass + Al$_2$O$_3$ | 850 | 3 to 5 | Less than 5 | AA |
| S06 | Ag | TiB$_2$ | 3 | SiO$_2$-B$_2$O$_3$-CaO glass + Al$_2$O$_3$ | 850 | 3 to 5 | Less than 5 | AA |
| S07 | Ag | None | - | SiO$_2$-B$_2$O$_3$-CaO glass + Al$_2$O$_3$ | 850 | N/A | 42 | XX |

FIG. 3

CERAMIC SUBSTRATE

TECHNICAL FIELD

The present invention relates to a ceramic substrate.

BACKGROUND ART

There has been known a ceramic substrate having a ceramic layer mainly formed of a glass ceramic and a conductor trace containing silver (Ag) as a main component. Such a ceramic substrate is formed by applying a conductor paste which is the pre-firing form of the conductor trace to a green sheet which is the pre-firing form of the ceramic layer and then firing the green sheet carrying the conductor paste applied thereto. Such a ceramic substrate is also called a low temperature co-fired ceramic (LTCC) substrate.

When the ceramic substrate is formed by firing, a silver component of the conductor paste diffuses into the ceramic layer. This may cause, for example, formation of voids in the ceramic layer, deformation of the ceramic layer, and change of the color of the ceramic layer. It is considered that diffusion of the silver component into the ceramic layer is accelerated by oxidation of the silver component of the conductor trace.

Patent Document 1 discloses a technique of preventing diffusion of the silver component into the ceramic layer by covering the surfaces of silver powder particles contained in the conductor paste with an antimony salt. Patent Document 2 discloses a technique of preventing diffusion of the silver component into the ceramic layer by adding a silicon powder to the conductor paste.

PRIOR ART DOCUMENTS

Patent Documents

Patent Document 1: Japanese Patent Application Laid-Open (kokai) No. H6-252524
Patent Document 2: Japanese Patent Application Laid-Open (kokai) No. 2007-234537

SUMMARY OF THE INVENTION

Problem to be Solved by the Invention

However, the techniques disclosed in Patent Documents 1 and 2 cannot sufficiently prevent diffusion of the silver component of the conductor paste into the ceramic layer in some cases.

Means for Solving the Problem

The present invention has been accomplished to solve the above-described problem. The present invention can be realized as follows.

(1) One mode of the present invention is a ceramic substrate including a ceramic layer mainly formed of a glass ceramic and a conductor trace mainly formed of silver (Ag). In the ceramic substrate, in an adjacent region located adjacent to the conductor trace, the concentration of boron atoms (B) contained in the ceramic layer increases toward the conductor trace. According to this mode, it is possible to prevent problems caused by diffusion of the silver component, for example, formation of voids in the ceramic layer, deformation of the ceramic layer, or change of the color of the ceramic layer. Thus, the quality of the ceramic substrate can be improved.

(2) In the ceramic substrate of the above-described mode, the adjacent region may include a region in which the concentration of boron atoms (B) is at least three times that in a central region of the ceramic layer centrally located in a thickness direction. According to this mode, it is possible to sufficiently prevent problems caused by diffusion of the silver component, for example, formation of voids in the ceramic layer, deformation of the ceramic layer, or change of the color of the ceramic layer.

(3) In the ceramic substrate of the above-described mode, the conductor trace may contain at least either of lanthanum atoms (La) and titanium atoms (Ti). According to this mode, it is possible to prevent problems caused by diffusion of the silver component, for example, formation of voids in the ceramic layer, deformation of the ceramic layer, or change of the color of the ceramic layer.

(4) In the ceramic substrate of the above-described mode, the ceramic substrate may contain borosilicate glass and alumina ($Al_2O_3$). This mode can improve the quality of the borosilicate glass-based ceramic substrate.

The present invention is not limited to the ceramic substrate, and can be realized in various other forms. For example, the present invention can be realized in the form of a method of manufacturing a ceramic substrate, an apparatus including a ceramic substrate, or a manufacturing apparatus for manufacturing a ceramic substrate.

BRIEF DESCRIPTION OF THE DRAWINGS

FIG. 3 Table showing the results of an evaluation test.

MODES FOR CARRYING OUT THE INVENTION

A. Embodiment

Figure 1:
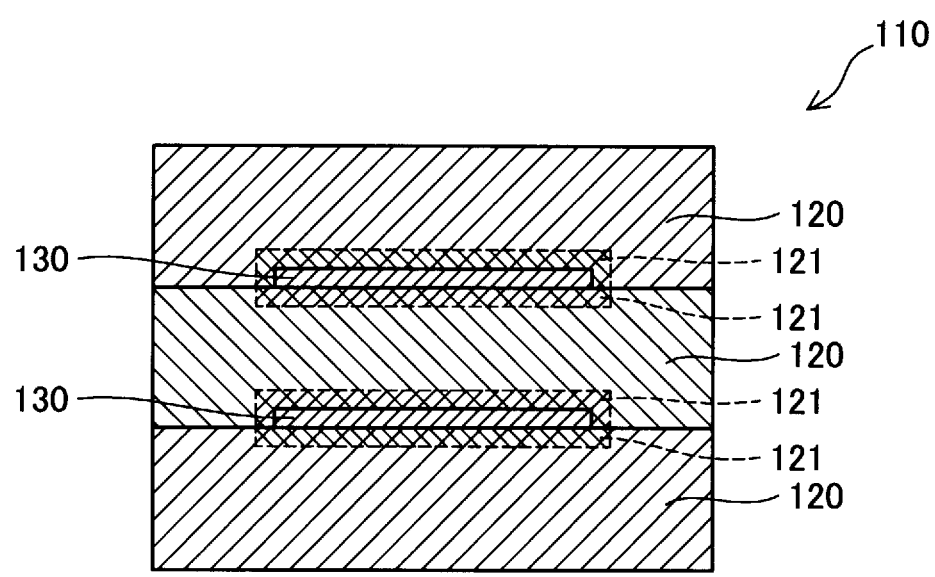
FIG. 1 Explanatory view schematically showing a cross section of a ceramic substrate.

FIG. 1 is an explanatory view schematically showing a cross section of a ceramic substrate 110. The ceramic substrate 110 is a low temperature co-fired ceramic (LTCC) substrate. At least a portion of a circuit for realizing a predefined function is formed on the ceramic substrate 110. In the present embodiment, a circuit for transmitting signals among electronic components, etc. is formed in the ceramic substrate 110.

The ceramic substrate 110 includes ceramic layers 120 and conductor traces 130. The ceramic substrate 110 has a structure in which each conductor trace 130 is formed between the adjacent ceramic layers 120 laminated together. In the present embodiment, the ceramic substrate 110 has unillustrated vias and unillustrated through holes in addition to the conductor traces 130 as conductors which form the circuit. In another embodiment, the ceramic substrate 110 may include two or more conductor traces 130 which are laminated together with other ceramic layers 120.

The ceramic layers 120 of the ceramic substrate 110 have electrically insulating properties. The ceramic layers 120 are mainly formed of a glass ceramic. In this description, "mainly formed of (a component)" means that the component accounts for at least 50 mass % of the entirety. In the present embodiment, each of the ceramic layers 120 is a ceramic layer which is formed by firing a borosilicate glass powder and an alumina ($Al_2O_3$) powder. Borosilicate glass is mainly formed of silicon dioxide ($SiO_2$), alumina ($Al_2O_3$), and boron oxide ($B_2O_3$).

The ceramic layer 120 includes adjacent regions 121 located adjacent to the conductor traces 130. In each of the adjacent regions 121, the concentration of boron atoms (B) contained in the ceramic layer 120 increases toward the corresponding conductor trace 130. In the present embodiment, each of the adjacent regions 121 includes a region in which the concentration of boron atoms (B) is at least three times that in a central region of the ceramic layer 120 centrally located in the thickness direction.

The conductor traces 130 of the ceramic substrate 110 are mainly formed of silver (Ag). In the present embodiment, the conductor traces 130 contain a silver (Ag) powder and a borosilicate glass powder, and have electrical conductivity. In the present embodiment, the conductor traces 130 contain at least either of lanthanum atoms (La) and titanium atoms (Ti). In the present embodiment, each of the conductor traces 130 has a thickness of about 10 μm.

Figure 2:
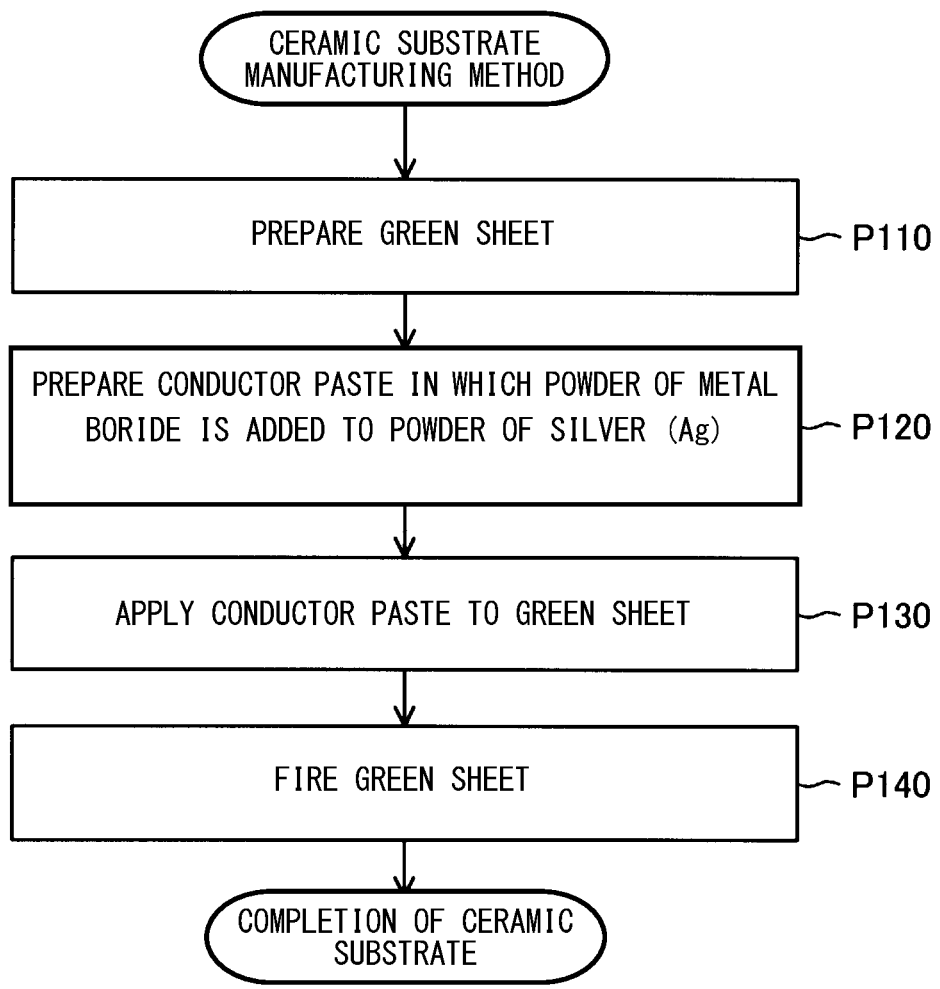
FIG. 2 Flowchart showing a method of manufacturing the ceramic substrate.

FIG. 2 is a flowchart showing a method of manufacturing the ceramic substrate 110. First, a green sheet which is the pre-firing form of the ceramic layers 120 is prepared (step P110).

The green sheet is formed by mixing a binder, a plasticizer, a solvent, etc., into powders of inorganic components and forming the resultant mixture into the shape of a thin plate (sheet). In the present embodiment, powders of borosilicate glass and alumina which are inorganic components are weighed such that their volume ratio becomes 60:40 and the total weight becomes 1 kg. These powders are placed in a container (pot) formed of alumina. Subsequently, 120 g of acrylic resin serving as a binder, a proper amount of methyl ethyl ketone (MEK) serving as a solvent, and a proper amount of dioctyl phthalate (DOP) serving as a plasticizer are added to the materials (powders) in the pot. The materials in the pot are mixed for five hours to thereby obtain a ceramic slurry. Then, a green sheet is made from the ceramic slurry using the doctor blade method. In the present embodiment, the green sheet has a thickness of 0.15 mm. In the present embodiment, the green sheet is formed into a desired shape by means of punching.

After preparing the green sheet (step P110), a conductor paste which is the pre-firing form of the conductor traces 130 is prepared (step P120). The conductor paste which is the pre-firing form of the conductor traces 130 is prepared by adding a powder of a metal boride to a powder of silver (Ag).

From the viewpoint of preventing diffusion of silver into the ceramic layers 120, the metal boride to be added to the conductor paste is preferably at least one of lanthanum hexaboride ($LaB_6$), silicon hexaboride ($SiB_6$), and titanium diboride ($TiB_2$). From the viewpoint of sufficiently preventing diffusion of silver into the ceramic layers 120, the amount of the metal boride with respect to the amount of the inorganic components of the conductor paste is preferably 3 vol. % to 9 vol. %.

In the present embodiment, for preparing the conductor paste which is the pre-firing form of the conductor traces 130, a powdery mixture of silver (Ag) which is an electrically conductive material and borosilicate glass which is common with the ceramic layers 120 is prepared as an inorganic component material of the conductor paste. Subsequently, a powder of the metal boride, ethyl cellulose serving as a binder, and terpineol serving as a solvent are added to the powdery mixture of the inorganic components. The resultant material is kneaded with a triple roll mill, whereby the conductor paste is obtained.

After preparing the conductor paste (step P120), the conductor paste is applied to the green sheet (step P130). In the present embodiment, the conductor paste is applied to the green sheet by means of screen printing.

After applying the conductor paste to the green sheet (step P130), the green sheet carrying the conductor paste applied thereto is fired (step P140). Thus, the ceramic substrate 110 is completed.

In the present embodiment, a plurality of the green sheets are laminated to form a laminate before firing the green sheet. In the present embodiment, by cutting operation, the laminate is formed into a shape suitable for firing. In the present embodiment, the laminate is exposed to an atmosphere of 250° C. for 10 hours for debindering. In the present embodiment, after debindering, the laminate is exposed to an atmosphere of 850° C. for 60 minutes for firing. After these steps, the ceramic substrate 110 is obtained.

When the laminate is fired, oxygen near the conductor paste is consumed by oxidation of the metal boride which is the additive component contained in the conductor paste. As a result, oxidation of the silver component contained in the conductor paste is prevented. Thus, diffusion of the silver component into the ceramic layers 120 is prevented.

At least a portion of the metal boride which is the additive component oxidized during firing diffuses into the adjacent regions 121 of the ceramic layers 120, which regions are located adjacent to the conductor traces 130. Therefore, in the adjacent regions 121 located adjacent to the conductor traces 130, the concentration of boron atoms (B) contained in the ceramic layers 120 increases toward the conductor traces 130. From the viewpoint of sufficiently preventing diffusion of silver into the ceramic layers 120, each of the adjacent regions 121 preferably includes a region in which the concentration of boron atoms (B) is at least three times that in a central region of the ceramic layer 120 centrally located in the thickness direction.

When lanthanum hexaboride ($LaB_6$) is added to the conductor paste, each of the conductor traces 130 includes lanthanum atoms (La) which originate from the additive component. When titanium diboride ($TiB_2$) is added to the conductor paste, each of the conductor traces 130 includes titanium atoms (Ti) which originate from the additive component.

FIG. 3 is a table showing the results of an evaluation test. In the evaluation test whose results are shown in FIG. 3, samples S01 to S07 of the ceramic substrate 110 were made through use of different conductor pastes. In the table of FIG. 3, the amount of the additive in the conductor paste which is the pre-firing form of the conductor traces 130 is shown as the amount (volume percent) of the additive with respect to the amount of the inorganic components of the ceramic paste.

The method of preparing the samples S01 to S06 is the same as that described with reference to FIG. 2. The method of preparing the sample S07 is the same as that described with reference to FIG. 2 except that the metal boride is not added to the conductor paste.

A cross section of each sample was observed using a scanning electron microscope (SEM) and an electron probe micro analyzer (EPMA) to measure the distance of diffusion of boron (B) and silver (Ag) into each ceramic layer 120. The concentration of boron (B) in a central region of each ceramic layer 120 centrally located in the thickness direction was used as a reference concentration, and the distance between the interface between the ceramic layer 120 and the corresponding conductor trace 130 and a position in the ceramic layer 120 at which the concentration of boron (B) becomes less than three times the reference concentration was measured at 10 points as a boron diffusion distance. The concentration of silver (Ag) at the interface between the ceramic layer 120 and the conductor trace 130 was used as a reference concentration, and the distance between the interface and a position in the ceramic layer 120 at which the concentration of silver (Ag) becomes half the reference concentration was measured at 10 points. The average of the measured distances was obtained as a silver diffusion distance.

Each sample was evaluated on the basis of the following criteria.

AA (excellent): The silver diffusion distance is less than 5 μm.

XX (poor): The silver diffusion distance is equal to or greater than 5 μm.

The evaluation results of the samples S01 to S06 and S07 show that diffusion of silver into the ceramic layers 120 can be prevented by adding one of lanthanum hexaboride ($LaB_6$), silicon hexaboride ($SiB_6$), and titanium diboride ($TiB_2$), which are metal borides, to the conductor paste which is the pre-firing form of the conductor traces 130. The evaluation results also show that diffusion of silver into the ceramic layers 120 can be sufficiently prevented when the amount of the metal boride with respect to the amount of the inorganic components of the conductor paste which is the pre-firing form of the conductor traces 130 is 3 vol. % to 9 vol. %. The evaluation results also show that, when diffusion of silver into each ceramic layer 120 is sufficiently prevented, a region in which the concentration of boron atoms (B) is at least three times that in a central region of the ceramic layer 120 centrally located in the thickness direction is formed in the ceramic layer 120 as an adjacent region 121.

According to the embodiment described above, in the ceramic substrate 110, the concentration of boron atoms (B) contained in the ceramic layers 120 increases toward the conductor traces 130 in the adjacent regions 121 located adjacent to the conductor traces 130. As a result, it is possible to prevent problems caused by diffusion of the silver component, for example, formation of voids in the ceramic layers 120, deformation of the ceramic layers 120, or change of the color of the ceramic layers 120. Thus, the quality of the ceramic substrate 110 can be improved.

Each of the adjacent regions 121 includes a region in which the concentration of boron atoms (B) is at least three times that in a central region of the ceramic layer 120 centrally located in the thickness direction. As a result, it is possible to sufficiently prevent problems caused by diffusion of the silver component, for example, formation of voids in the ceramic layers 120, deformation of the ceramic layers 120, or change of the color of the ceramic layers 120.

B. Other Embodiments

The present invention is not limited to the above-described embodiment, examples, and modifications, but may be embodied in various other forms without departing from the spirit of the invention. For example, in order to solve, partially or entirely, the above-mentioned problem or yield, partially or entirely, the above-mentioned effects, technical features of the embodiments, examples, and modifications corresponding to technical features of the modes described in the section "SUMMARY OF THE INVENTION" can be replaced or combined as appropriate. Also, the technical feature(s) may be eliminated as appropriate unless the present specification mentions that the technical feature(s) is mandatory.

In another embodiment, when the conductor paste which is the pre-firing form of the conductor traces 130 is prepared (step P120), before adding a binder and a solvent to the raw material powder, the powder of the metal boride is caused to adhere to the surfaces of silver (Ag) powder particles by mixing the powder of the metal boride into the raw material powder. This prevents diffusion of the silver component from the conductor traces 130 into the ceramic layers 120 to a greater degree.

DESCRIPTION OF REFERENCE NUMERALS

110 . . . ceramic substrate
120 . . . ceramic layer
121 . . . adjacent region
130 . . . conductor trace

What is claimed is:

1. A ceramic substrate comprising a ceramic layer mainly formed of a glass ceramic and a conductor trace mainly formed of silver (Ag), wherein in an adjacent region located adjacent to the conductor trace, the concentration of boron atoms (B) contained in the ceramic layer increases toward the conductor trace.

2. The ceramic substrate according to claim 1, wherein the adjacent region includes a region in which the concentration of boron atoms (B) is at least three times that in a central region of the ceramic layer centrally located in a thickness direction.

3. The ceramic substrate according to claim 1, wherein the conductor trace contains at least either of lanthanum atoms (La) and titanium atoms (Ti).

4. The ceramic substrate according to claim 1, wherein the ceramic layer contains borosilicate glass and alumina ($Al_2O_3$).

5. The ceramic substrate according to claim 1, wherein the ceramic layer includes a first ceramic layer and a second ceramic layer, the conductor trace is formed between the first ceramic layer and the second ceramic layer, and in the adjacent region located adjacent to the conductor trace, the concentration of boron atoms (B) contained in the first ceramic layer and the second ceramic layer increases toward the conductor trace.

* * * * *